United States Patent
Ishihara et al.

[11] Patent Number: 5,822,239
[45] Date of Patent: Oct. 13, 1998

[54] METHOD OF WRITING DATA TO A SINGLE TRANSISTOR TYPE FERROELECTRIC MEMORY

[75] Inventors: Hiroshi Ishihara; Eisuke Tokumitsu, both of Tokyo, Japan

[73] Assignee: Tokyo Institute of Technology, Tokyo, Japan

[21] Appl. No.: 891,157

[22] Filed: Jul. 10, 1997

[30] Foreign Application Priority Data

Aug. 20, 1996 [JP] Japan .................................. 8-218215

[51] Int. Cl.$^6$ ...................................................... G11C 11/22
[52] U.S. Cl. ............................................ 365/145; 257/295
[58] Field of Search ...................................... 365/145, 295

[56] References Cited

U.S. PATENT DOCUMENTS 5,666,305  9/1997  Mihara et al. ............................ 365/145

FOREIGN PATENT DOCUMENTS 06068288  3/1994  Japan .
7-31705  3/1994  Japan .

*Primary Examiner*—Huan Hoang
*Attorney, Agent, or Firm*—Spencer & Frank

[57] ABSTRACT

The invention is directed to a writing method to effectively suppress inter-cell interference when writing data to a single transistor type ferroelectric memory. When V is a writing voltage, stripe-like conducting electrodes are row electrodes, and semiconductor stripes are column electrodes, then the writing method includes a first procedure and a successive second procedure based on V/3 rule. In the first procedure, when a voltage of +V is applied to the row electrode of the cell being observed, while a voltage of zero is applied to the column electrode, and voltages of +V/3 are applied to the other row electrodes, and voltages of +(⅔)V are applied to the other column electrodes, then in the second procedure, a voltage of zero is applied to the row electrode of the cell being observed, while a voltage of +V/3 is applied to the column electrode, and voltages of +V/3 are applied to the other row electrodes, and voltages of zero are applied to the other column electrodes. In the first procedure, when a voltage of −V is applied to the row electrode of the cell being observed, while a voltage of zero is applied to the column electrode, and voltages of −V/3 are applied to the other row electrodes, and voltages of −(⅔)/V are applied to the other column electrodes, then in the second procedure, a voltage of zero is applied to the row electrode of the cell being observed, while a voltage of −V/3 is applied to the column electrode, and voltages of −V/3 are applied to the other row electrodes, and voltages of zero are applied to the other column electrodes.

3 Claims, 4 Drawing Sheets

FIG_1A
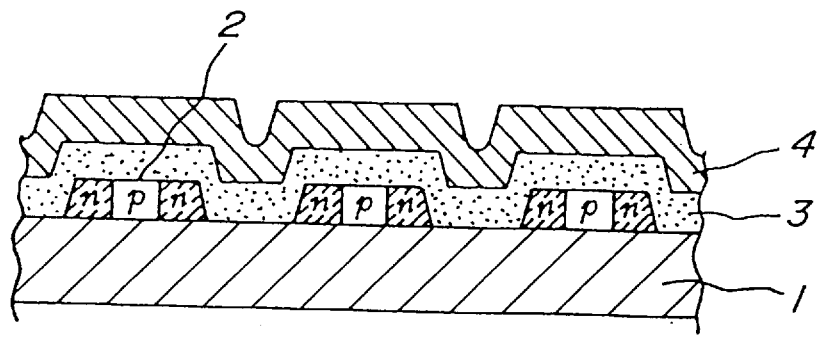
FIG_1B
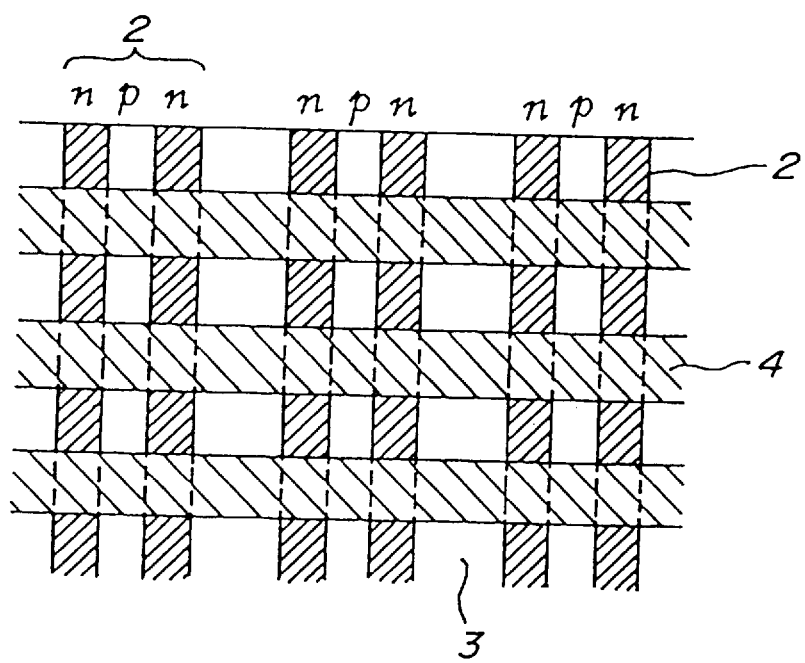

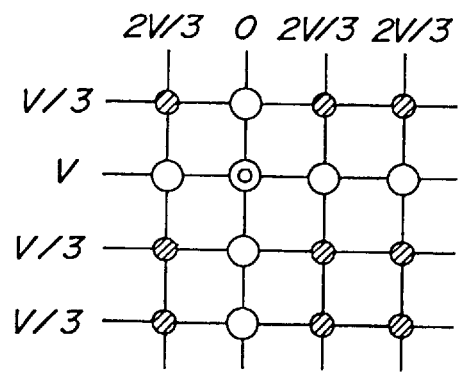
FIG_2A
First procedure
⊚ : V    ○ : V/3    ⊘ : -V/3
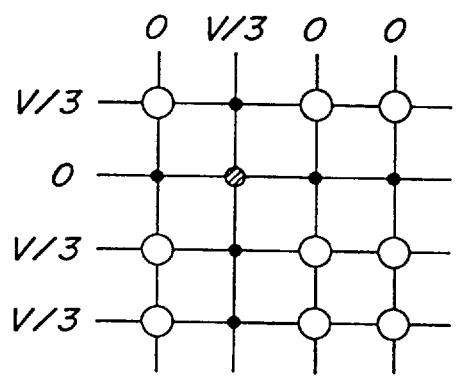
FIG_2B
Second procedure
○ : V/3    ⊘ : -V/3    • : 0

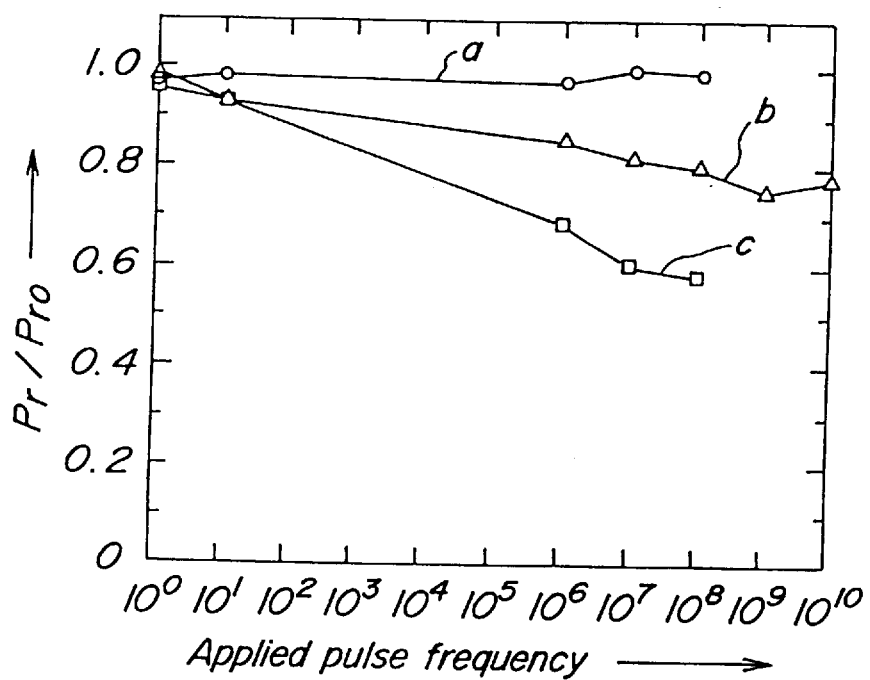
FIG_3

FIG_4
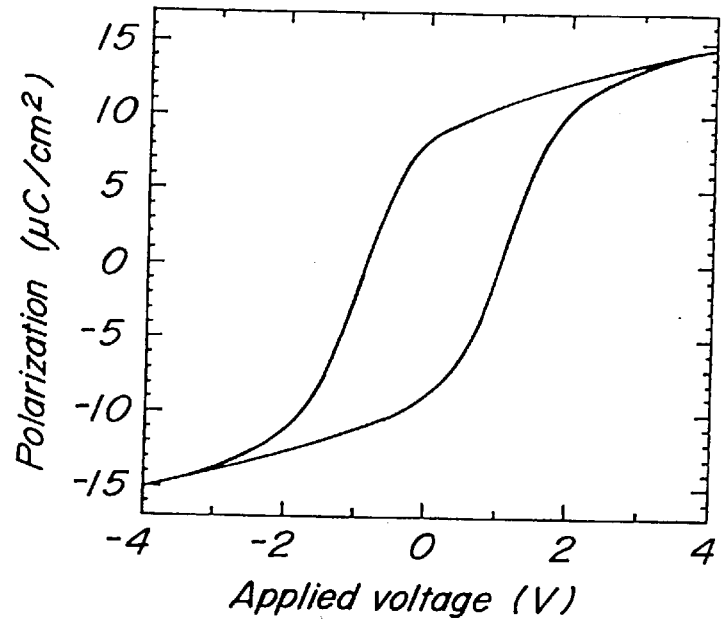
FIG_5
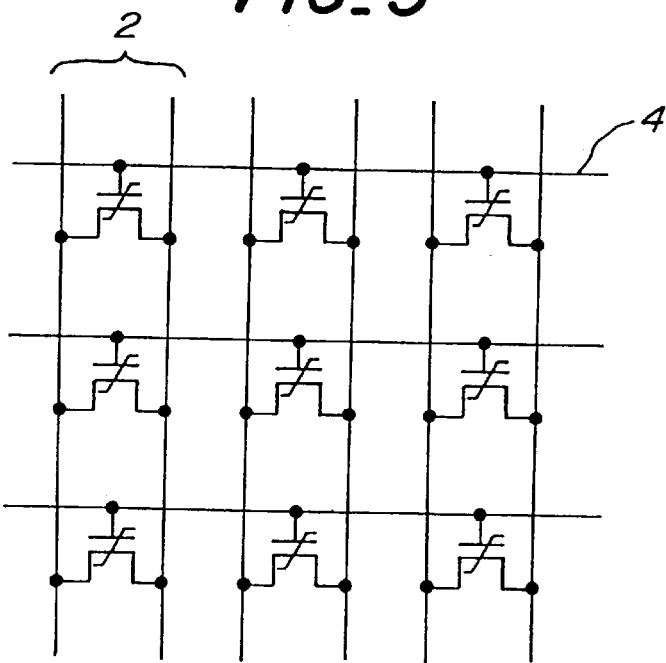

METHOD OF WRITING DATA TO A SINGLE TRANSISTOR TYPE FERROELECTRIC MEMORY

BACKGROUND OF THE INVENTION

1. Field of the Invention

The present invention relates to a method of writing data to a single transistor type ferroelectric memory.

2. Description of the Related Art

Non-volatile memories which use a ferroelectric material, generally have a two element per cell construction with a normal MOS transistor and a ferroelectric capacitor per cell. With such memories however, there is the drawback that when reading stored information, the information (data) is destroyed (destruction reading). Moreover, in contrast to EEPROM which use two floating gate type FETs per cell, the flash memory is a single transistor type non-volatile memory which uses one floating gate type FET per cell. However, in cases where a floating gate type FET is used, writing of data cannot be accomplished during normal operation time of the computer, and with the flash memory, erasure for each cell, that is to say for each bit, is not possible.

Though the flash memory has the above drawback, since there is one element per cell then area effectivity is good. With the present invention, the subject memory is also aimed at this single transistor type non-volatile memory, being a single transistor type ferroelectric memory to be described later in detail. The essential difference between this memory and the former is that instead of the requirement for erasing information prior to writing at the floating gate type FET of each cell of the flash memory, with the ferroelectric type FET according to the present invention, the erasing operation is not necessary. That is to say, the saturation phenomena in the polarization of a ferroelectric film is used, thus giving the advantage that problems do not arise as with the floating gate type FET, where an excessive charge is injected to the floating gate and an excessive charge is extracted.

The single transistor type ferroelectric memory, being the subject memory of the present invention, differs from DRAM, or the capacity type FRAM (ferroelectric RAM) currently under investigation, in that the capacity is not contained in the cell. Hence miniaturization of the memory element is possible depending on scaling rules. Furthermore, as described later, with the single transistor type ferroelectric memory, being the subject of the present invention, there is an advantage of high densification, since via-holes for taking out electrodes are not necessary. Hence in addition to the non-volatility characteristics, it is expected to find favor for future high integration low power consumption memories.

The memory of the present component has a three layer construction with the single crystal semiconductor thin films of the bottom-most layer and the conducting electrodes of the uppermost layer completely separated and in stripe formation. However when a writing voltage is applied from a peripheral circuit to a cell being observed, the influence of the writing voltage also extends to the other cells along the upper and lower stripes, thus presenting the problem of a large mutual interference between the cells at the time of writing.

SUMMARY OF THE INVENTION

It is therefore an object of the present invention to provide a method of writing data to a memory, being a single transistor type ferroelectric memory according to the present invention, having the advantages of non volatility, high integration ability, and low power consumption, which method can effectively suppress inter-cell interference at the time of writing.

In order to achieve the above objective, then with the method of writing data to a single transistor type ferroelectric memory according to the present invention, in the writing of data to a single transistor type ferroelectric memory having a plurality of single crystal semiconductor thin films of mutually parallel stripe-like pnp or npn structure formed in columns on an insulated substrate, a ferroelectric thin film deposited thereon so as to cover at least the semiconductor stripe structure, and a plurality of mutually parallel stripe-like conducting electrodes deposited on top of the ferroelectric thin film in a direction approximately perpendicular to the plurality of stripe-like semiconductor thin films, and the transistors formed at the intersections of the semiconductor stripes and the stripe-like conducting electrodes as respective single memory cells, then when V is the writing voltage, the stripe-like conducting electrodes are row electrodes, and the semiconductor stripes are column electrodes, the writing method includes a first procedure and a successive second procedure based on V/3 rule. In the first procedure, when a voltage of +V is applied to the row electrode of the cell being observed, while a voltage of zero is applied to the column electrode, and voltages of +V/3 are applied to the other row electrodes, and voltages of +(⅔)V are applied to the other column electrodes, then in the second procedure, a voltage of zero is applied to the row electrode of the cell being observed, while a voltage of +V/3 is applied to the column electrode, and voltage of +v/3 are applied to the other row electrodes, and voltages of zero are applied to the other column electrodes. In the first procedure, when a voltage of −V is applied to the row electrode of the cell being observed, while a voltage of zero is applied to the column electrode, and voltages of −V/3 are applied to the other row electrodes, and voltages of −(⅔)V are applied to the other column electrodes, then in the second procedure, a voltage of zero is applied to the row electrode of the cell being observed, while a voltage of −V/3 is applied to the column electrode, and voltages of −V/3 are applied to the other row electrodes, and voltages of zero are applied to the other column electrodes.

By applying the method of the present invention, the writing of data to a single transistor type ferroelectric memory can be executed while effectively suppressing inter-cell interference. Hence the advantages of the memory can be more effectively put to use.

BRIEF DESCRIPTION OF THE DRAWINGS

FIG. 1 shows the structure of a single transistor type ferroelectric memory to which the method of the present invention is applied, (a) being a cross-sectional view and (b) being a plan view;

FIG. 2 is a diagram for explaining a method of the invention, (a) being a first procedure, and (b) being a second procedure;

FIG. 3 is a diagram illustrating experimental examples showing the polarization change of a ferroelectric thin film ($SrBi_2Ta_2O_9$) for various pulse application methods;

FIG. 4 is a diagram showing the hysteresis characteristics of the voltage and polarization of the ferroelectric thin film ($SrBi_2Ta_2O_9$) used in FIG. 3; and FIG. 5 is a diagram showing an equivalent circuit for the single transistor type ferroelectric memory to which the method of the present invention is applied.

Throughout different views of the drawing in FIGS. 1–5, 1 is an insulated substrate, 2 is a thin film, 3 is a ferroelectric thin film, 4 is a plurality of mutually parallel stripe-like conducting electrode.

DESCRIPTION OF THE PREFERRED EMBODIMENTS

As follows is a detailed description of embodiments of the present invention with reference to the accompanying drawings.

FIG. 1 shows a cross-sectional view (FIG. 1(a)) and a plan view (FIG. 1(b)) of the structure of a single transistor type ferroelectric memory to which the method of the present invention is applied.

In FIG. 1, a plurality of single crystal semiconductor thin films 2 having an npn sequence structure in the transverse direction, are formed in columns on an insulated substrate 1, with for example silicon single crystal thin film formed in mutually parallel stripe formation. A ferroelectric thin film 3 is deposited on top of this thin film 2 so as to cover at least the semiconductor stripe structure. Furthermore, a plurality of mutually parallel stripe-like conducting electrodes 4 (for example metal electrodes) are deposited on top of this layer in a direction approximately perpendicular to the plurality of stripe-like semiconductor thin films 2. With the transistors formed at the intersections of the semiconductor stripes and the conducting electrodes, the opposite side n regions are the source and the drain, while the intermediate p regions are the channels. Moreover, the transistors in the columns are all connected in parallel (refer to FIG. 5) due to the source and the drain regions being connected as semiconductor stripes.

The structure of this component is referred to as a single transistor type ferroelectric memory, known for example from Japanese Patent Publication No. 7-31705 (Self Learning Type Sum of Products Operation Circuit Element and Circuit). With this structure, a field effect transistor is formed with the ferroelectric thin film 3 being used for the gate insulator. When this structure is used, then if a positive voltage is applied for example to a word line, that is to say, a stripe-like conducting electrode 4 formed on the upper layer, and a negative voltage is applied to a silicon stripe, or alternatively voltages are applied in accordance with the first procedure of claim 1, then a large potential difference can be applied to only the ferroelectric thin film located at the point of intersection. Hence selective writing of data becomes possible. This is because even though the potential difference is removed by the application of the large potential difference to the ferroelectric thin film, a charge corresponding to the remanent polarization remains on the semiconductor surface, and hence the data attains a written condition.

If with the selective writing, a negative voltage V applied to the stripe-like electrode 4 side is made to correspond to data 1, and an opposite polarity is made to correspond to data 0, then digital data writing becomes possible. Moreover, in reading the data, the stripe-like conducting thin film on top of the ferroelectric thin film corresponding to the selected cell of the memory is made the gate electrode, and a voltage which is relatively low compared to the voltage V is applied to this gate electrode, and a voltage is applied from the peripheral circuit, between the source and drain of the underneath npn semiconductor crystal. If the drain current flowing at this time is then read from the peripheral circuit, data of 0 or 1 depending on the magnitude thereof can be read. In order to carry out such a reading operation, the transistor structure and the polarization of the ferroelectric film may be adjusted so that at the time of writing 0, the threshold voltage for the transistor becomes sufficiently high, while at the time of writing 1, this becomes sufficiently low.

Next is a description with reference to FIG. 2(a) and (b), of a first procedure and an immediately following second procedure as disclosed in the claims of the present invention, for effectively controlling inter-cell interference at the time of writing to a ferroelectric memory of such a structure.

A first example of writing to a non-volatile memory according to the method of the present invention is based on the following procedure. A voltage V is applied to a selected word line 4 while voltages V/3 are applied to the non selected word lines 4. Moreover a voltage 0 is applied to a selected silicon stripe 2, while voltages 2V/3 are applied to the non selected silicon stripes 2. As a result, as shown in FIG. 2(a), a potential difference of V occurs only at the gate insulator (ferroelectric layer) of the selected cell, while potential differences of + or −V/3 occur at the gate insulators of all the other cells. Selective polarization control thus becomes possible due to this difference. Since with the writing of the information, the threshold voltage of the FET changes, then a gate voltage suitable for reading can be applied to detect the presence of a drain current, and information once written is not lost at the time of reading. The above covers the first procedure. If immediately after carrying out the writing by applying the voltages as shown in FIG. 2(a), voltages as shown in FIG. 2(b) are applied, then with the cells which were not selected, voltages of +V/3 are applied to the cells which were subjected to the voltages of −V/3 at the time of writing. As a result, the inter-cell mutual interference during writing can be significantly reduced. The above covers the second procedure.

What should be noted here is that with the cells other than the writing cell, in the line and column of the cell selected for writing, in the first procedure voltages of V/3 are applied for example in the row direction, and in the second procedure voltages of zero are applied, and hence there is not complete cancellation. Furthermore, with the column direction in the second procedure, a voltages of zero are applied relative to the V/3 voltages of the first procedure and hence again there is not complete cancellation. However, the number of relevant cells in the case where the total cell number is for example 500×500, is of low probability at approximately 1/250 of the total cell number. Furthermore, as will become apparent from the experimental results given later, the significant mutual interference occurs where the writing voltage after writing with a voltage of V is continuously subjected to the majority of the interference voltage of −V/3 in the reverse direction. Therefore, considering that the memory carries out a random access operation, then overall this is not a problem.

With the beforementioned example, the writing is made with a positive V. However, this can also be made with a negative −V. In this case, all the signs for the voltages applied in the first procedure and in the second procedure are reversed.

Experimental clarification that the inter-cell mutual interference at the time of writing can be greatly reduced by means of the first procedure and the second procedure is illustrated by FIG. 3. FIG. 3 gives measurements of polarization change of a ferroelectric thin film after effecting writing by application of a +V pulse to an experimental sample to be described later, being equivalent to one cell of the ferroelectric memory according to the present invention. FIG. 3(a) is for the case where a positive interference pulse (+V/3) only is applied, (b) is for the case where a positive pulse (+V/3) and a negative pulse (-V/3) are applied alternately, while (c) is for the case where a negative pulse (-V/3) only is applied. With the writing method of the present invention shown in FIG. 2(a) and FIG. 2(b), the great majority of the cells corresponded to the experimental results of FIG. 3(b). Accordingly, these experimental results show that, if the writing method of the present invention is used, then with the ferroelectric gate insulator of a selected cell which has been written with information, if this cell is not subsequently selected, then even after carrying out $10^{10}$ writing operations to the other cells, approximately 80% of the polarization is maintained. Considering that the judgment of the 0 and the 1 of the written data becomes impossible when the vertical axis value becomes 50%, then it can be concluded that the present invention effectively suppresses inter-cell interference at the time of writing.

In FIG. 3, the horizontal axis shows the number of applied pulses while the vertical axis shows the amount of change in the polarization charge (Pr/Pro; where Pro is the initial value). The sample used here was an MFM (metal/ferroelectric/film metal) capacitor to be described hereunder. An approximately 250 nm thick $SrBi_2Ta_2O_9$ film was deposited on a $Pt/Ti/SiO_2/Si$ substrate using the sol-gel method. The substrate was silicon crystal bulk with $SiO_2$ formed thereon, and platinum on tungsten electrodes on top of this as lower electrodes. Platinum electrodes of 200 $\mu$m diameter were used as top electrodes, the ferroelectric coating of $SrBi_2Ta_2O_9$ being subjected both before and after forming the upper platinum electrodes, to a heat treatment of 750° C. for 30 minutes. FIG. 4 shows the characteristics of the dielectric hysteresis curve for the film. The experimental pulse V applied to the sample was 1.5 volt. Consequently, V/3 was 0.5 volts and the pulse width was 3 $\mu$s.

The present invention has been described above in relation to one embodiment. However the present invention is not limited to this embodiment, and it will be apparent that various modifications and changes are possible within the scope of the invention as disclosed in the claims. For example, with the one embodiment the description has been for a silicon single crystal thin film as the single crystal semiconductor thin film. However single crystal thin films of other semiconductors such as GaAs, InSb may also be used. Moreover, for the ferroelectric film, the description has been for a film of $SrBi_2Ta_2O_9$. However other thin films exhibiting ferroelectric characteristics may of course be used.

As will be clear from the above detailed description, by applying the method of writing data according to the present invention to a single transistor type ferroelectric memory, then inter-cell interference at the time of writing can be effectively suppressed. Therefore a high quality non-volatile memory, combined with the various excellent characteristics of a memory of non volatility, high integration and low power consumption, can be provided.

What is claimed is:

1. A method of writing data to a single transistor type ferroelectric memory, wherein in the writing of data to a single transistor type ferroelectric memory having a plurality of single crystal semiconductor thin films of mutually parallel stripe-like pnp or npn structure formed in columns on an insulated substrate, a ferroelectric thin film deposited thereon so as to cover at least the semiconductor stripe structure, and a plurality of mutually parallel stripe-like conducting electrodes deposited on top of this layer in a direction approximately perpendicular to the plurality of stripe-like semiconductor thin films, and the transistors formed at the intersections of the semiconductor stripes and the stripe-like conducting electrodes as respective single memory cells, then when V is the writing voltage, the stripe-like conducting electrodes are row electrodes, and the semiconductor stripes are column electrodes, said writing method includes a first procedure and a successive second procedure based on V/3 rule, comprising:

in said first procedure, when a voltage of +V is applied to the row electrode of the cell being observed, while a voltage of zero is applied to the column electrode, and voltages of +V/3 are applied to the other row electrodes, and voltages of +($\frac{2}{3}$)V are applied to the other column electrodes, then in said second procedure, a voltage of zero is applied to the row electrode of the cell being observed, while a voltage of +V/3 is applied to the column electrode, and voltages of +V/3 are applied to the other row electrodes, and voltages of zero are applied to the other column electrodes, and in said first procedure, when a voltage of -V is applied to the row electrode of the cell being observed, while a voltage of zero is applied to the column electrode, and voltages of -V/3 are applied to the other row electrodes, and voltages of -($\frac{2}{3}$)V are applied to the other column electrodes, then in said second procedure, a voltage of zero is applied to the row electrode of the cell being observed, while a voltage of -V/3 is applied to the column electrode, and voltage of -V/3 are applied to the other row electrodes, and voltages of zero are applied to the other column electrodes.

2. A method of writing data to a single transistor type ferroelectric memory, according to claim 1, wherein said single crystal semiconductor thin film is silicon crystal thin film.

3. A method of writing data to a single transistor type ferroelectric memory, according to claim 1, wherein said stripe-like conducting electrode is a stripe-like metal electrode.

\* \* \* \* \*